(12) United States Patent
Sawamura

(10) Patent No.: US 9,147,472 B2
(45) Date of Patent: Sep. 29, 2015

(54) NONVOLATILE SEMICONDUCTOR MEMORY DEVICE HAVING STACKED MEMORY CELL LAYERS AND A CONTROL CIRCUIT CONTROLLING WRITE OR READ BASED ON PARAMETERS ACCORDING TO A SELECTED MEMORY CELL LAYER

(71) Applicant: Kabushiki Kaisha Toshiba, Minato-ku (JP)

(72) Inventor: Kenji Sawamura, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 62 days.

(21) Appl. No.: 14/060,943

(22) Filed: Oct. 23, 2013

(65) Prior Publication Data

US 2015/0049551 A1 Feb. 19, 2015

Related U.S. Application Data

(60) Provisional application No. 61/867,209, filed on Aug. 19, 2013.

(51) Int. Cl.
*G11C 16/00* (2006.01)
*G11C 16/06* (2006.01)

(52) U.S. Cl.
CPC ..................... *G11C 16/06* (2013.01)

(58) Field of Classification Search
USPC .............. 365/185.11, 185.17, 185.22, 185.28
See application file for complete search history.

(56) References Cited

U.S. PATENT DOCUMENTS

| 7,602,028 | B2 | 10/2009 | Son et al. | |
|---|---|---|---|---|
| 7,781,807 | B2 | 8/2010 | Nishihara et al. | |
| 2011/0038213 | A1* | 2/2011 | Ichikawa et al. | 365/185.18 |
| 2012/0026804 | A1* | 2/2012 | Nagashima et al. | 365/189.06 |
| 2012/0217571 | A1 | 8/2012 | Arai et al. | |
| 2015/0003157 | A1* | 1/2015 | Aritome | 365/185.11 |

FOREIGN PATENT DOCUMENTS

| JP | 2008-98641 | 4/2008 |
|---|---|---|
| JP | 2008-140912 | 6/2008 |
| JP | 2010-212604 | 9/2010 |
| JP | 2012-178473 | 9/2012 |
| JP | 2013-69932 | 4/2013 |

* cited by examiner

*Primary Examiner* — Hoai V Ho
(74) *Attorney, Agent, or Firm* — Oblon, McClelland, Maier & Neustadt, L.L.P.

(57) ABSTRACT

According to an embodiment, a nonvolatile semiconductor memory device comprises a memory cell array and a control circuit. The memory cell array includes a plurality of memory cell layers that are stacked. Each memory cell layer comprises a plurality of memory cells formed on a semiconductor layer. The plurality of memory cell layers include: a first memory cell layer where the semiconductor layer is configured of monocrystalline silicon; and a second memory cell layer where the semiconductor layer is configured of polycrystalline silicon. The control circuit, when controlling write or read of data to/from a memory cell belonging to the first memory cell layer, performs control based on a first parameter, and when controlling write or read of data to/from a memory cell belonging to the second memory cell layer, performs control based on a second parameter that differs from the first parameter.

10 Claims, 8 Drawing Sheets

NONVOLATILE SEMICONDUCTOR MEMORY DEVICE HAVING STACKED MEMORY CELL LAYERS AND A CONTROL CIRCUIT CONTROLLING WRITE OR READ BASED ON PARAMETERS ACCORDING TO A SELECTED MEMORY CELL LAYER

CROSS-REFERENCE TO RELATED APPLICATIONS

This application is based upon and claims the benefit of U.S. Provisional Patent Application No. 61/867,209, filed on Aug. 19, 2013, the entire contents of which are incorporated herein by reference.

BACKGROUND

1. Field

Embodiments described herein relate to a nonvolatile semiconductor memory device.

2. Description of the Related Art

A memory cell configuring a nonvolatile semiconductor memory device such as a NAND type flash memory or a NOR type flash memory includes a control gate and a charge accumulation layer. The memory cell changes its threshold voltage based on a charge accumulated in the charge accumulation layer, and stores a magnitude of this threshold voltage as data. In recent years, raising of density of the memory cells in such nonvolatile semiconductor memory devices has been proceeding.

DETAILED DESCRIPTION

A nonvolatile semiconductor memory device according to an embodiment comprises: a memory cell array that stores data; and a control circuit that controls write and read of data to/from the memory cell array. The memory cell array includes a plurality of memory cell layers that are stacked. Each memory cell layer comprises a plurality of memory cells formed in a semiconductor layer. The plurality of memory cell layers include: a first memory cell layer where the semiconductor layer is configured of monocrystalline silicon; and a second memory cell layer where the semiconductor layer is configured of polycrystalline silicon. The control circuit, when controlling write or read of data to/from a memory cell belonging to the first memory cell layer, performs control based on a first parameter, and when controlling write or read of data to/from a memory cell belonging to the second memory cell layer, performs control based on a second parameter that differs from the first parameter.

A nonvolatile semiconductor memory device according to an embodiment of the present invention will be described below with reference to the drawings.

First Embodiment

Overall Configuration

Figure 1:
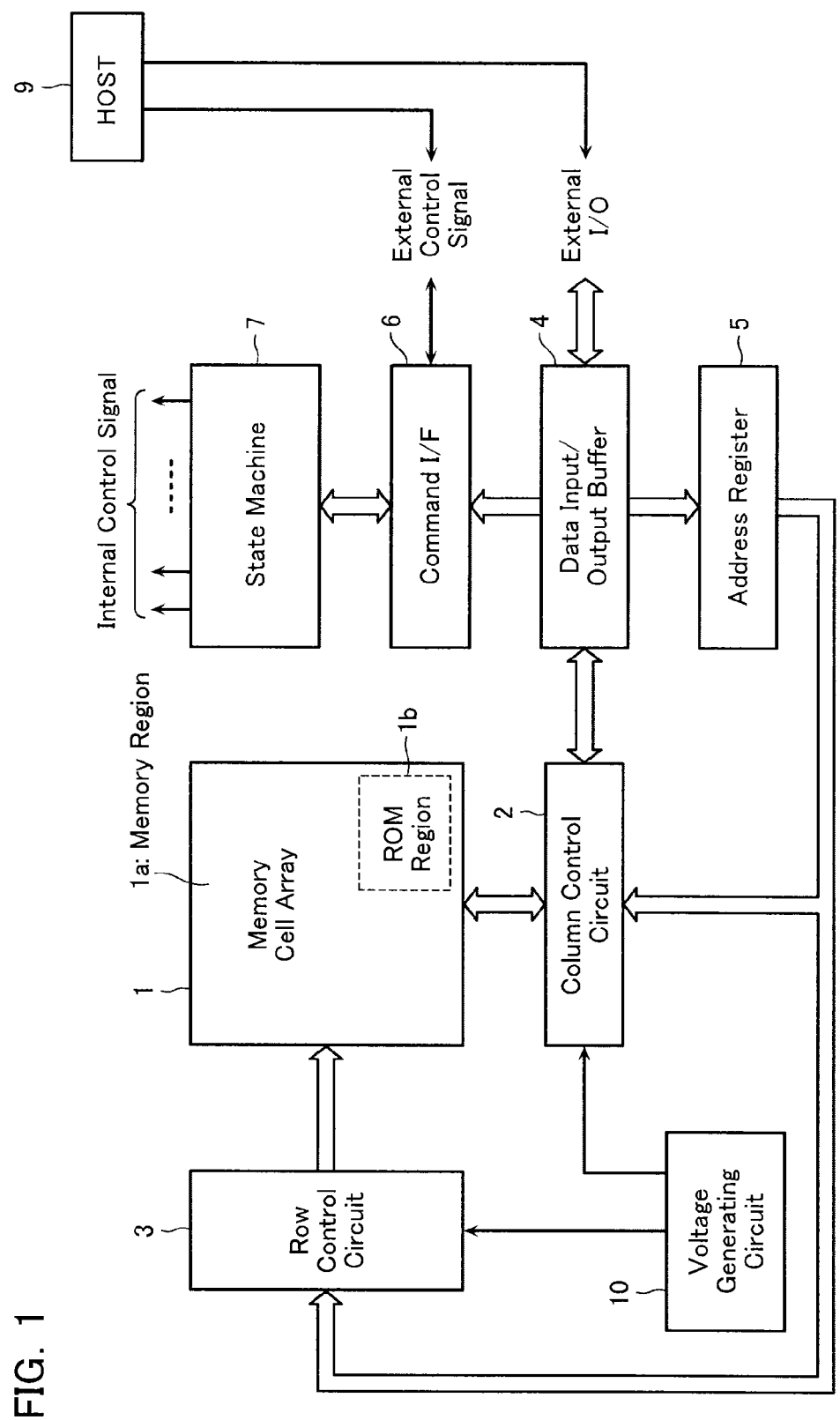
FIG. 1 is a block diagram showing a configuration of a nonvolatile semiconductor memory device according to a first embodiment.

FIG. 1 is a block diagram of a nonvolatile semiconductor memory device according to a first embodiment of the present invention. This nonvolatile semiconductor memory device includes a memory cell array 1 configured having a plurality of memory cell layers stacked therein. The memory cell layer has a plurality of memory cells MC disposed in a matrix therein, and the memory cell array 1 has bit lines BL and word lines WL that are connected to these memory cells MC disposed orthogonally to each other therein. In addition, the memory cell array 1 has provided therein: a memory region 1a that stores data; and a ROM region 1b that stores parameters employed in control of the nonvolatile semiconductor memory device or the like. Note that in the present embodiment, it is possible to use different parameters according to the memory cell layer, and these parameters being used according to the memory cell layer are stored in the ROM region 1b.

Provided in a periphery of this memory cell array 1 are a column control circuit 2 and a row control circuit 3. The column control circuit 2 controls voltage of the bit line BL and performs data erase of the memory cell, data write to the memory cell, and data read from the memory cell. The row control circuit 3 selects the word line WL and applies a voltage for data erase of the memory cell, data write to the memory cell, and data read from the memory cell.

A data input/output buffer 4 is connected to an external host 9 via an I/O line to receive write data, receive an erase instruction, output read data, and receive address data or command data. The data input/output buffer 4 sends write data received from the external host 9 to the column control circuit 2, and receives data read from the column control circuit 2 to be outputted to external. An address supplied to the data input/output buffer 4 from external is sent to the column control circuit 2 and the row control circuit 3 via an address register 5.

In addition, a command supplied to the data input/output buffer 4 from the host 9 is sent to a command interface 6. The command interface 6 receives an external control signal from the host 9, judges whether data inputted to the data input/output buffer 4 is write data or a command or an address, and if a command, receives the data and transfers the data to a state machine 7 as a command signal.

The state machine 7 performs management of this nonvolatile semiconductor memory device overall, receiving a command from the host 9 via the command interface 6, and performing read, write, erase, management of input/output of data, and so on.

In addition, it is also possible for the external host 9 to receive status information managed by the state machine 7, and thereby judge an operation result. Moreover, this status information is utilized also in control of write and erase.

In addition, the state machine 7 controls a voltage generating circuit 10. This control enables the voltage generating circuit 10 to output a pulse having any voltage value at any timing. Moreover, the voltage generating circuit 10 in the present embodiment is also capable of outputting pulses having different voltage values according to the memory cell layer being accessed. In the present embodiment, amplitude of the outputted pulse is determined based on an instruction from the state machine 7, but may also be determined by, for example, inputting an address from the address register 5 to the voltage generating circuit 10. Moreover, the outputted pulse may also be selected by the column control circuit 2 and the row control circuit 3.

Now, the outputted pulse can be transferred to any line selected by the column control circuit 2 and the row control circuit 3. These column control circuit 2, row control circuit 3, state machine 7, and voltage generating circuit 10, and so on, configure a control circuit in the present embodiment.

[Memory Cell Array]

Figure 2:
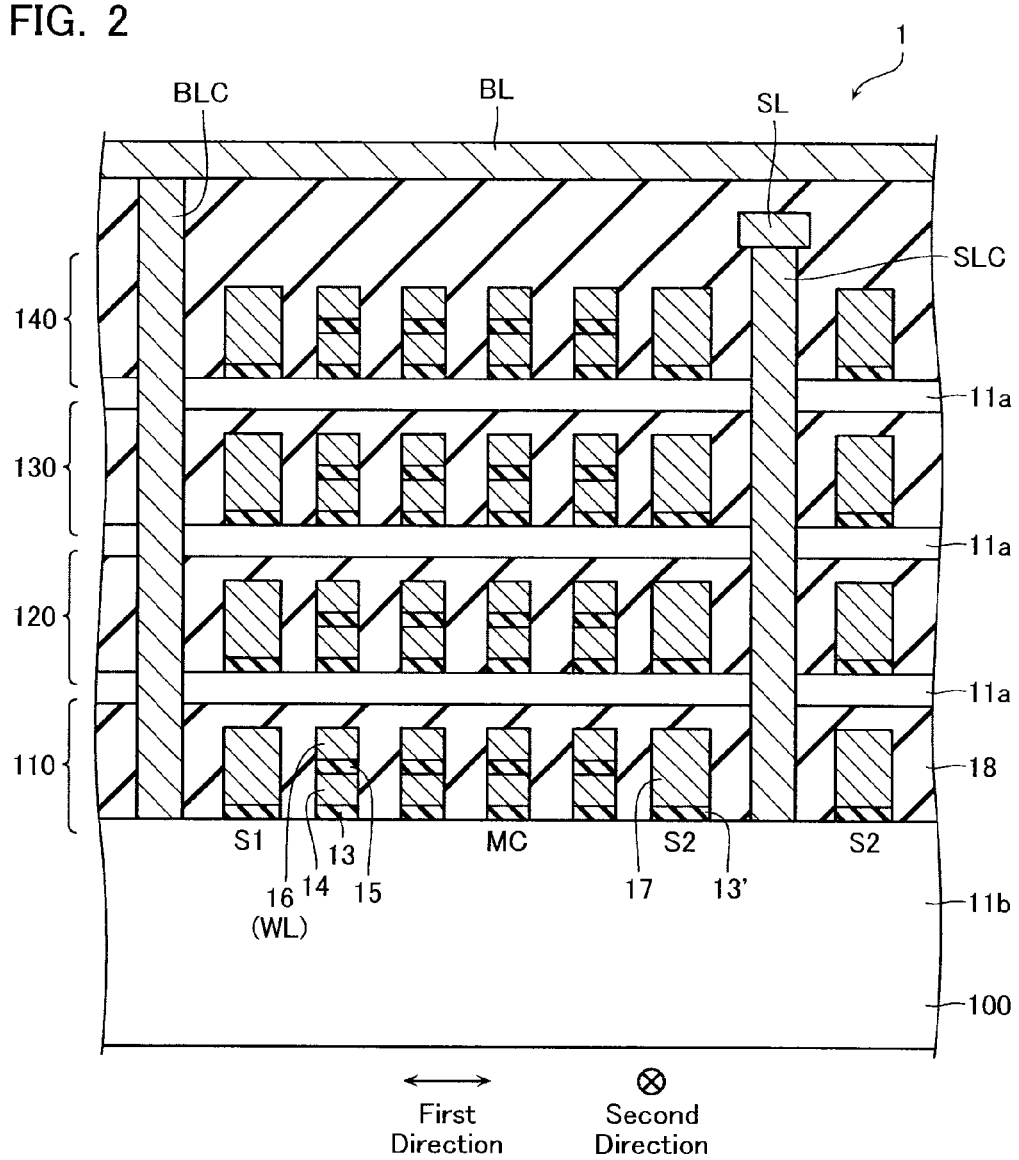
FIG. 2 is a schematic cross-sectional view showing part of a memory cell array in the same nonvolatile semiconductor memory device.

FIG. 2 shows schematically a cross-sectional structure of the memory cell MC and select gate transistors S1 and S2. As shown in FIG. 2, the memory cell array 1 is configured having a plurality of memory cell layers 110, 120, 130, and 140 stacked therein. In the present embodiment, the memory cell layer 110 in a lowermost layer is configured as the ROM region (second memory region) 1b, and the memory cell layers 120, 130, and 140 in layers other than the lowermost layer are configured as the memory region (first memory region) 1a. The lowermost memory cell layer 110 has a comparatively high reliability, hence may preferably have the parameter employed in control held therein. Therefore, the ROM region 1b is employed as a parameter storage region.

The lowermost memory cell layer 110 is formed on a substrate 100 so as to include a plurality of the memory cells MC formed arranged in a matrix in a left-right direction of FIG. 2 (first direction) and a direction orthogonal to a plane of paper (second direction), and such that a semiconductor layer 11b in an upper portion of the substrate 100 acts as a channel body. Therefore, in the present embodiment, the semiconductor layer 11b is formed of monocrystalline silicon which is an upper layer of a bulk wafer (hereinafter called "bulk silicon"). Note that the semiconductor layer 11b may have formed therein an element isolation trench extending in the first direction for isolating from each other the memory cells MC adjacent in the second direction. The memory cell MC comprises the semiconductor layer 11b, a tunnel insulating layer (a gate insulating layer) 13 formed on this semiconductor layer 11b and a stacked gate, the stacked gate including: a floating gate 14 formed on the tunnel insulating layer 13 and functioning as a charge accumulation layer; an inter-gate insulating layer (an inter-layer insulating layer) 15 formed on this floating gate 14; and a control gate 16 formed on this inter-gate insulating layer 15. The control gate 16 extends in the second direction to form the word line WL. Moreover, a plurality of the memory cells MC arranged in the first direction are NAND connected so as to share each other's source and drain and thereby configure a memory string.

Formed at the two ends of the memory string are the select gate transistors S1 and S2. The select gate transistors S1 and S2 comprise: the semiconductor layer 11b; a select gate insulating layer 13' formed on the semiconductor layer 11b; and a gate electrode 17 formed on the select gate insulating layer 13'. The gate electrode 17 extends in the second direction to form a select gate line. Moreover, these plurality of memory cells MC and select gate transistors S1 and S2 are filled in by an insulating layer 18.

Each memory cell MC accumulates a charge in the floating gate 14 and holds this as data. The more an accumulated amount of the charge in the floating gate 14 increases, the greater becomes a voltage (hereinafter called "threshold voltage") for setting the memory cell MC to an ON state. Therefore, by determining whether the memory cell MC is in an ON state or not when a certain read voltage is applied to its control gate 16, it is possible to determine data written in the memory cell MC. In the present embodiment, four types of data, namely Erase, A, B, and C, are held in the memory cell MC. Therefore, three types of read voltages are set, and it is possible for data written in the memory cell MC to be determined by a magnitude relationship between the threshold voltage and said three types of read voltages.

The non-lowermost memory cell layers 120, 130, and 140 are basically configured similarly to the lowermost memory cell layer 110, but a semiconductor layer 11a forming a channel body differs from the semiconductor layer 11b of the lowermost memory cell layer 110. In the present embodiment, the semiconductor layer 11a is formed of polysilicon, not bulk silicon as is the semiconductor layer 11b. Therefore, a manufacturing cost can be reduced compared to the case where the semiconductor layer 11a is manufactured by, for example, a means such as epitaxial growth or the like. The semiconductor layer 11a is formed extending in, for example, the first direction. Hereinafter, a memory cell MC formed in the lowermost memory cell layer 110 is called a lowermost-layer memory cell MC, and a memory cell MC formed in the non-lowermost memory cell layers 120, 130, and 140 is called a non-lowermost-layer memory cell MC.

In addition, a plurality of the bit lines BL are formed extending in the first direction on the insulating layer 18 in the uppermost memory cell layer 140. The bit line BL is connected to the semiconductor layers 11a and 11b in each of the memory cell layers 110, 120, 130, and 140 via a bit line contact BLC that penetrates the plurality of memory cell layers 110, 120, 130, and 140. The memory string is connected to the bit line contact BLC via the select gate transistor S1.

Furthermore, a source line SL is formed extending in the second direction in the insulating layer 18 in the uppermost memory cell layer 140. The source line SL is connected to the semiconductor layers 11a and 11b in each of the memory cell layers 110, 120, 130, and 140 via a source line contact SLC that penetrates the plurality of memory cell layers 110, 120, 130, and 140. The memory string is connected to the source line contact SLC via the select gate transistor S2.

Figure 3:
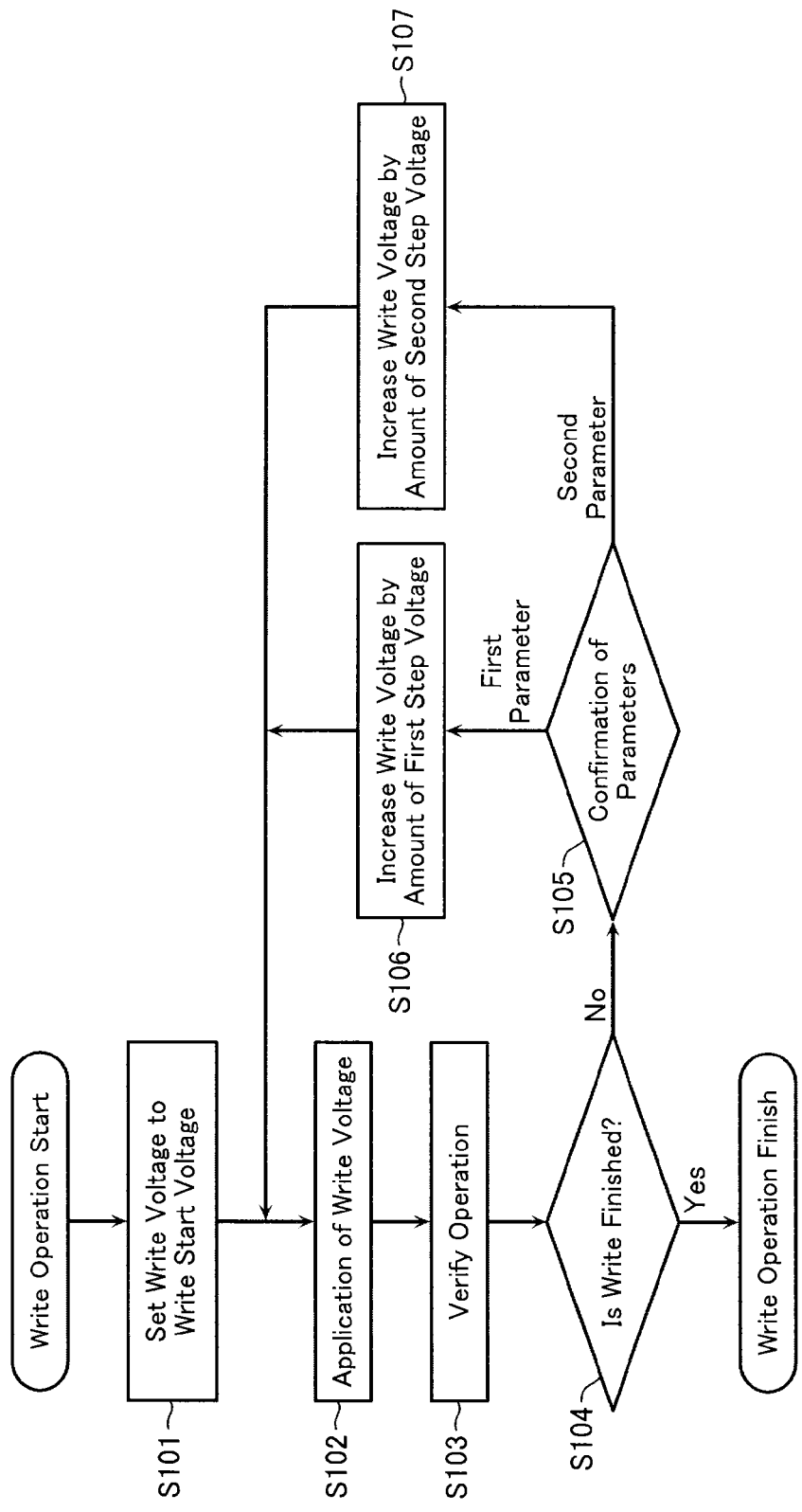
FIG. 3 is a flowchart for explaining a write operation of the same nonvolatile semiconductor memory device.

Write Operation of Nonvolatile Semiconductor Memory Device According to First Embodiment Next, a write operation of the nonvolatile semiconductor memory device according to the present embodiment will be described. FIG. 3 is a flowchart for explaining the same write operation. However, the flowchart shown in FIG. 3 is merely one example, and it is of course also possible to perform the write operation by a different flow.

In step S101, an initial setting of various kinds of voltage values in the write operation is performed. In the present embodiment, a write voltage applied to a selected word line WL in step S102 is set to a write start voltage.

In step S102, a bit line (hereinafter called "target bit line") BL connected to a memory cell (hereinafter called "selected memory cell") MC which is a target of a write is set to a ground state, a voltage of a bit line (hereinafter called "non-target bit line") BL connected to a memory cell (hereinafter called "non-selected memory cell") MC which is not the target of the write is set to a write prohibit voltage, the selected word line WL is applied with the write voltage and a non-selected word line WL is applied with a pass voltage, and, moreover, a gate of the select gate transistor S1 is applied with an ON voltage and a gate of the select gate transistor S2 is applied with a ground voltage. As a result, a charge is accumulated only in the floating gate 14 of the selected memory cell MC.

In step S103, a verify read operation is performed. That is, a potential difference is provided between the bit line BL and the source line SL, a verify voltage is provided to the selected word line WL and a read pass voltage is provided to the non-selected word line WL, and the select gate transistors S1 and S2 are both set to an ON state. At this time, if a threshold voltage of the selected memory cell MC is the verify voltage or more, then the write of the selected memory cell MC is finished, and the selected memory cell MC attains an OFF state. On the other hand, if the threshold voltage of the selected memory cell MC is less than the verify voltage, then the write of the selected memory cell MC is not finished, and the selected memory cell MC attains an ON state. The ON/OFF state of said selected memory cell MC is detected by a sense amplifier in the column control circuit 2 via the bit line BL, whereby it is determined whether the write of the selected memory cell MC has finished or not.

In step S104, it is confirmed whether the write of all of the selected memory cell MC has finished or not, and, if finished, the write operation finishes. If not finished, then in step S105, confirmation of a parameter to be used is performed. The parameter to be used is settable according to various conditions, and in the present embodiment, control is performed by a different parameter in the case where the write operation is performed on a lowermost-layer memory cell MC or in the case where the write operation is performed on a non-lowermost-layer memory cell MC. The present embodiment shows an example where the parameter is a step voltage of the write voltage.

That is, in the case where the write operation is performed on a lowermost-layer memory cell MC, in step S106, the write voltage is increased by an amount of a first step voltage. On the other hand, in the case where the write operation is performed on a non-lowermost-layer memory cell MC, in step S107, the write voltage is increased by an amount of a second step voltage. Note that the second step voltage is smaller than the first step voltage. In the present embodiment, the second step voltage is set smaller than the first step voltage by 50 mV or more.

Thereafter, operation of steps S102 and after is repeatedly performed until the write of all of the selected memory cells MC has finished, and, when it is determined in step S104 that the write of all of the selected memory cells MC has finished, the write operation finishes.

Now, in the present embodiment, the second step voltage is set smaller than the first step voltage for the following reason. That is, in polysilicon, variation in mobility of electrons is larger compared to in bulk silicon. Therefore, in a non-lowermost-layer memory cell MC where the semiconductor layer 11a is configured of polysilicon, variation in an amount of charge accumulated to the floating gate 14 during the write operation tends to be larger compared to in a lowermost-layer memory cell MC where the semiconductor layer 11b is configured of bulk silicon. As a result, it sometimes occurred that variation in characteristics between non-lowermost-layer memory cells MC manifested as variation in threshold voltages, whereby, as shown in FIG. 8B, a threshold distribution ended up spreading.

In order to reduce variation in the threshold voltage, it is effective to set the step voltage smaller, for example. That is, setting the step voltage smaller results in fluctuation in threshold between the verify read operations being suppressed and the write operation finishing based on a more minute change in the threshold voltage, which, in view of individual characteristics of the non-lowermost-layer memory cells MC, enables more accurate control of threshold to be performed. However, if said setting is uniformly adopted, then a write time to the lowermost-layer memory cell MC ends up increasing.

In the present embodiment, the first step voltage is employed when the write operation to the lowermost-layer memory cell MC is performed, and the second step voltage is employed when the write operation to the non-lowermost-layer memory cell MC is performed. It is therefore possible to increase reliability of the nonvolatile semiconductor memory device, without causing a deterioration in its operation speed.

Figure 4:
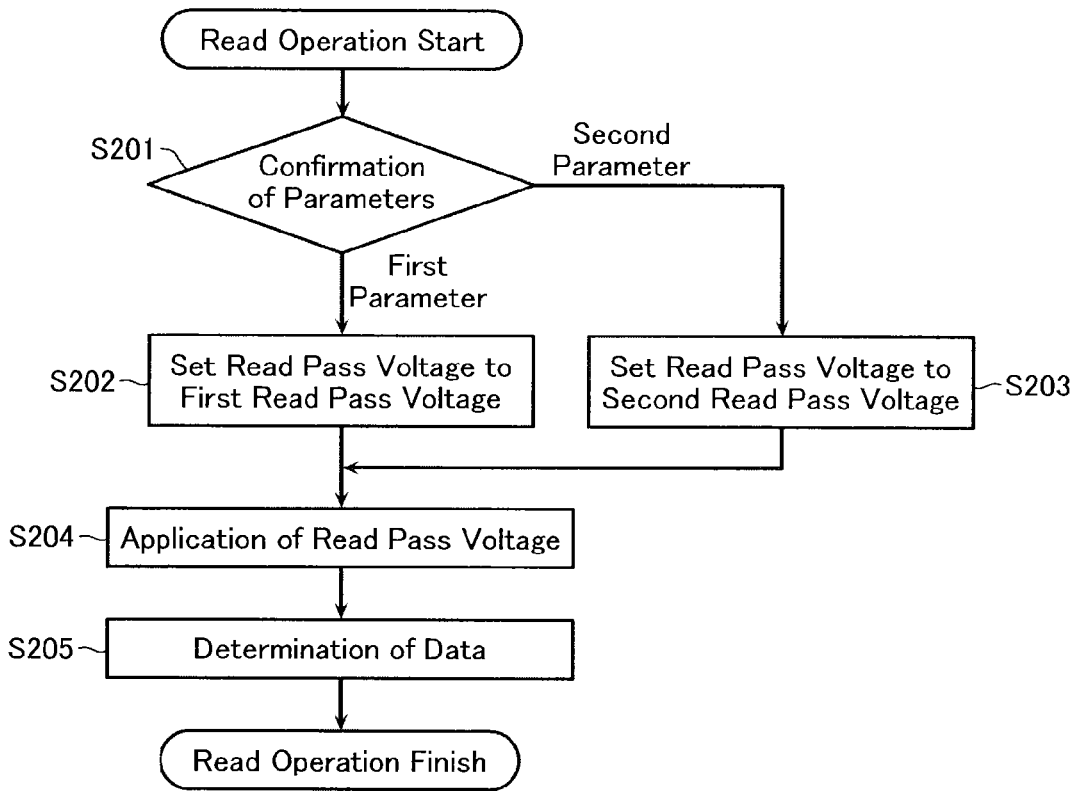
FIG. 4 is a flowchart for explaining a read operation of a nonvolatile semiconductor memory device according to a second embodiment.

Read Operation of Nonvolatile Semiconductor Memory Device According to Second Embodiment Next, a read operation of a nonvolatile semiconductor memory device according to a second embodiment of the present invention will be described. FIG. 4 is a flowchart for explaining the read operation or the verify read operation of the nonvolatile semiconductor memory device according to the second embodiment.

In this embodiment, the read pass voltage applied to a non-selected word line WL during the verify read operation or during the read operation is employed as the parameter, instead of the step voltage of the write voltage. That is, as shown in FIG. 4, in step S201, confirmation of the parameter to be used is performed. During the verify read operation or during the read operation of the lowermost-layer memory cell MC (when first parameter is confirmed to be used), in step S202, a first read pass voltage is set as the read pass voltage applied to the non-selected word line WL. During the verify read operation or during the read operation of the non-lowermost-layer memory cell MC (when second parameter is confirmed to be used), in step S203, a second read pass voltage which is larger than the first read pass voltage is set as the read pass voltage applied to the non-selected word line WL. Note that in the present embodiment, the second read pass voltage is set larger compared to the first read pass voltage by 500 mV or more. On the other hand, there is a risk that if the read pass voltage is set too high, application of the read pass voltage causes charge to get accumulated in the floating gate 14, hence an upper limit of the read pass voltage value is desirably set in view of this point.

In step S204, a potential difference is provided between the bit line BL and the source line SL, a read voltage is provided to the selected word line WL and the read pass voltage is provided to the non-selected word line WL, and the select gate transistors S1 and S2 are both set to the ON state. The ON/OFF state of the selected memory cell MC at this time is detected by the sense amplifier in the column control circuit 2 via the bit line BL. In step S205, data held in the selected memory cell MC is determined.

Figure 5:
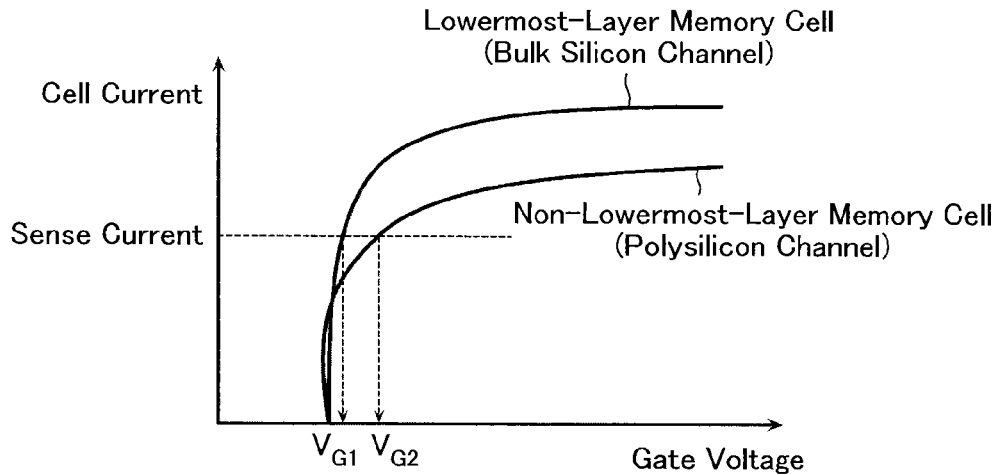
FIG. 5 is a graph showing characteristics of a memory cell in the same nonvolatile semi conduct or memory device.

FIG. 5 is a graph showing characteristics of the memory cell MC in the nonvolatile semiconductor memory device according to the present embodiment. FIG. 5 shows a relationship between a gate voltage and a cell current (current between source and drain) in the lowermost-layer memory cell MC including the semiconductor layer 11b configured of bulk silicon and the non-lowermost-layer memory cell MC including the semiconductor layer 11a configured of polysilicon. Mobility of electrons in polysilicon is greater than mobility of electrons in bulk silicon, hence electrons easily undergo lattice scattering in polysilicon, whereby current decreases more compared to the case of bulk silicon. Therefore, in the case that an identical gate voltage and source-drain voltage are applied to the lowermost-layer memory cell MC and the non-lowermost-layer memory cell MC, a current value in the lowermost-layer memory cell MC becomes comparatively high, and a current value in the non-lowermost-layer memory cell MC becomes comparatively low. As a result, as shown in FIG. 5, the gate voltage to obtain an identical sense current is a voltage $V_{G1}$ in the lowermost-layer memory cell MC, and in the non-lowermost-layer memory cell MC, is a voltage $V_{G2}$ which is larger than the voltage $V_{G1}$.

In light of this point, the semiconductor memory device according to the present embodiment is configured to, during the verify read operation or during the read operation of the lowermost-layer memory cell MC (when the first parameter is confirmed to be used), apply the first read pass voltage to the non-selected word line WL, and, during the verify read operation or during the read operation of the non-lowermost-layer memory cell MC (when the second parameter is confirmed to be used), apply the second read pass voltage which is larger than the first read pass voltage to the non-selected word line WL. Therefore, even at a time of the verify read operation or the read operation of the non-lowermost-layer memory cell MC, reduction of cell current in the non-selected memory cell can be prevented and an S-factor can be kept low, similarly to in the verify read operation or the read operation of the lowermost-layer memory cell MC.

Figure 6:
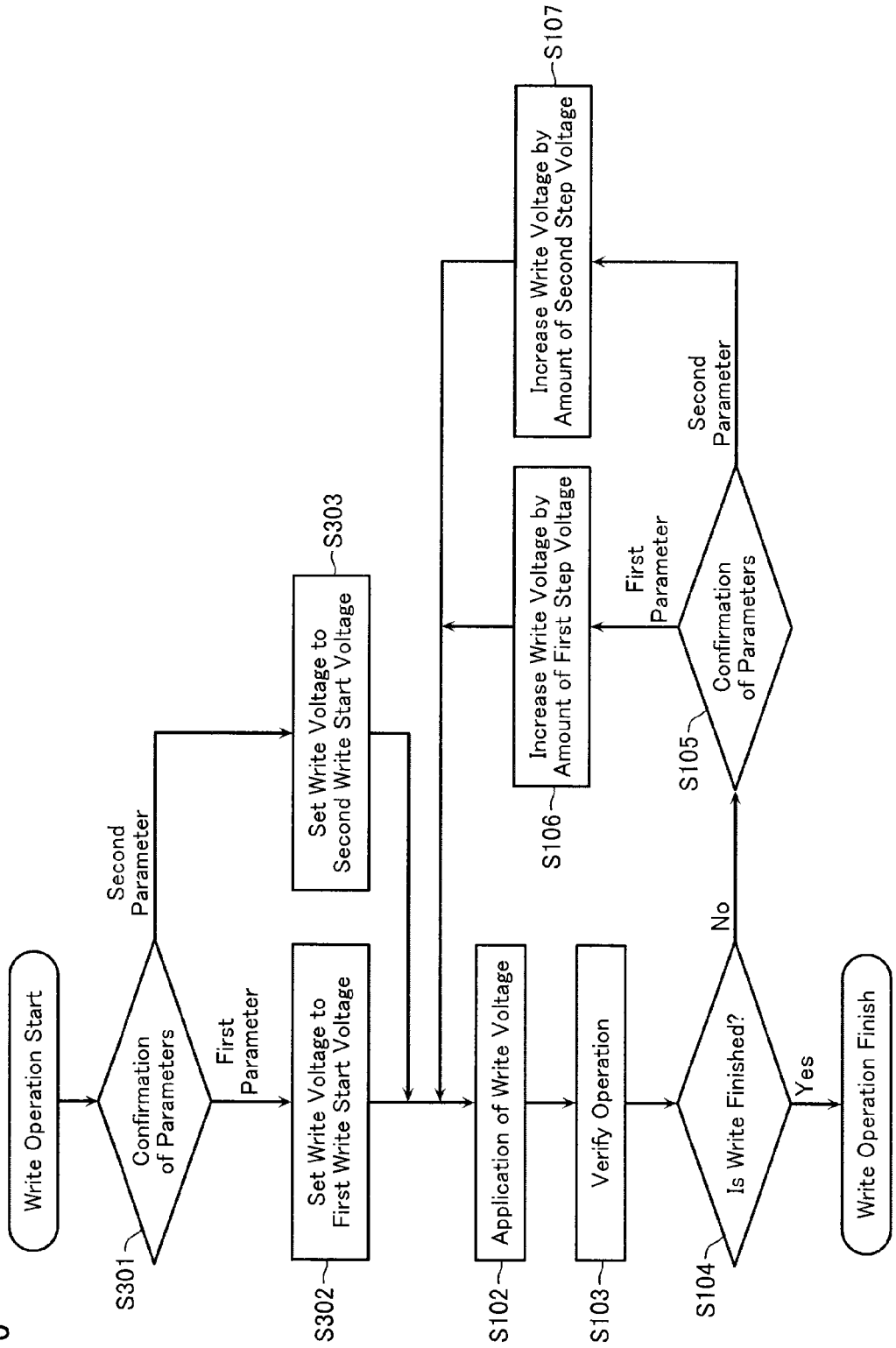
FIG. 6 is a flowchart for explaining a write operation of a nonvolatile semiconductor memory device according to a third embodiment.

Write Operation of Nonvolatile Semiconductor Memory Device According to Third Embodiment Next, a write operation of a nonvolatile semiconductor memory device according to a third embodiment of the present invention will be described. FIG. 6 is a flowchart for explaining the same operation. The write operation according to the present embodiment is basically similar to the write operation according to the first embodiment, but a method of initial setting of the various kinds of voltage values in the write operation is different. That is, in the first embodiment, the write start voltage was set to an identical value when the write operation in the lowermost-layer memory cell MC is performed and when the write operation in the non-lowermost-layer memory cell MC is performed (FIG. 3, step S101). In contrast, in the present embodiment, in step S301, confirmation of the parameter to be used is performed, and, in the case where the write operation is performed on the lowermost-layer memory cell MC, in step S302, the write voltage is set to a first write start voltage, and, in the case where the write operation is performed on the non-lowermost-layer memory cell MC, in step S303, the write voltage is set to a second write start voltage. Note that the second write start voltage is set smaller compared to the first write start voltage.

As mentioned previously, due to a difference in lattice state of the semiconductor layers 11a and 11b, there is a tendency for the non-lowermost-layer memory cell MC to be determined write-finished earlier in the write operation.

Now, if, for example, the write start voltage is adjusted to match the lowermost-layer memory cell MC, then in application of the write voltage immediately after start of the write operation (S102), an excessive charge is sometimes accumulated in the floating gate 14 of the non-lowermost-layer memory cell MC, whereby the threshold voltage of the non-lowermost-layer memory cell MC becomes too large.

In the present embodiment, the write voltage is set to the first write start voltage when the write operation is performed on the lowermost-layer memory cell MC, and the write voltage is set to the second write start voltage which is smaller than the first write start voltage when the write operation is performed on the non-lowermost-layer memory cell MC. It is therefore possible to prevent an excessive increase in the threshold voltage in the non-lowermost-layer memory cell MC and further increase reliability of the nonvolatile semiconductor memory device.

Note that in the present embodiment, the write start voltage and the step voltage are both adjusted according to whether the selected memory cell MC is a lowermost-layer memory cell MC or a non-lowermost-layer memory cell MC. However, it is also possible for, for example, the write start voltage only to be adjusted, and the step voltage to be set to an identical value. Moreover, a flow shown in FIG. 6 is merely one example, and control can also be performed by a different flow.

Read Operation of Nonvolatile Semiconductor Memory Device According to Fourth Embodiment Next, a read operation of a nonvolatile semiconductor memory device according to a fourth embodiment of the present invention will be described. The nonvolatile semiconductor memory device according to the present embodiment is basically configured similarly to the nonvolatile semiconductor memory devices according to the first through third embodiments, but a method of the read operation or the verify read operation is different.

Figure 7:
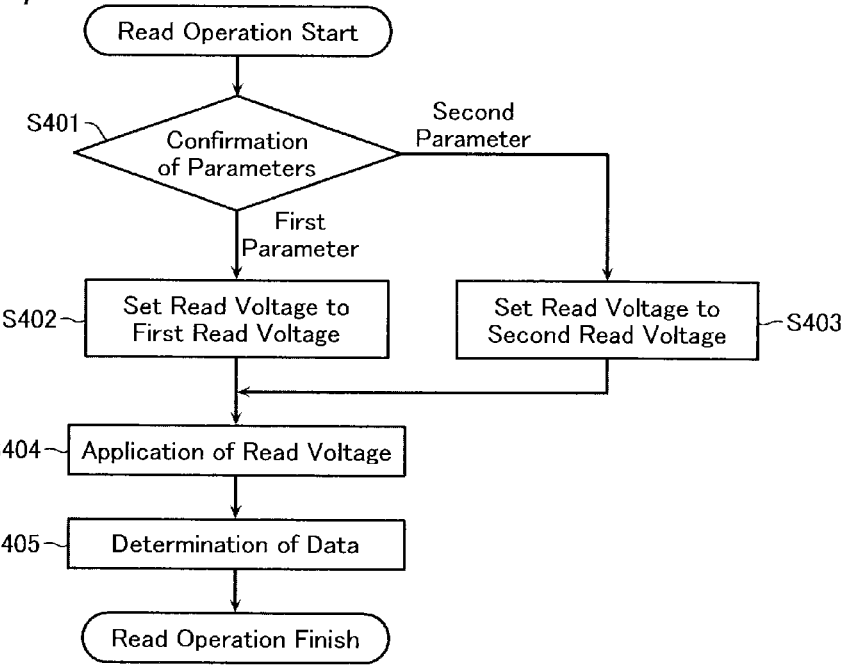
FIG. 7 is a flowchart for explaining a read operation of a nonvolatile semiconductor memory device according to a fourth embodiment.

FIG. 7 is a flowchart for explaining the method of the read operation or the verify read operation of the nonvolatile semiconductor memory device according to the present embodiment. In step S401, confirmation of the parameter to be used is performed. In the case where the read operation is performed on the lowermost-layer memory cell MC, in step S402, the read voltage is set to a first read voltage. Moreover, in the case where the read operation is performed on the non-lowermost-layer memory cell MC, in step S403, the read voltage is set to a second read voltage.

In step S404, a potential difference is provided between the bit line BL and the source line SL, the read voltage is provided to the selected word line WL and the read pass voltage is provided to the non-selected word line WL, and the select gate transistors S1 and S2 are both set to the ON state. The ON/OFF state of the selected memory cell MC at this time is detected by a sense amplifier in the column control circuit 2 via the bit line BL. In step S405, data held in the selected memory cell MC is determined.

Figure 8A:
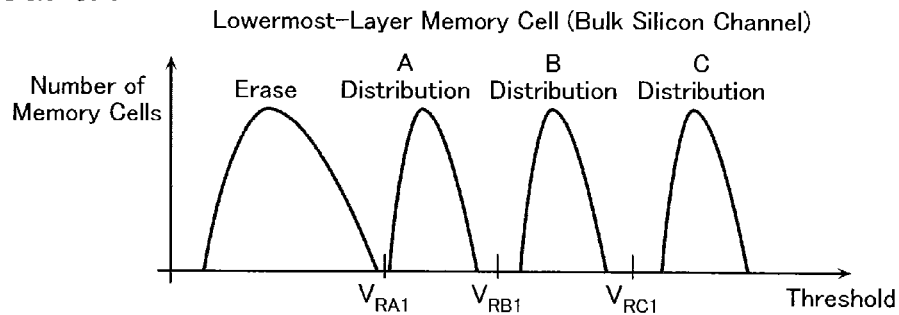
FIGS. 8A and 8B are histograms showing threshold distributions of a memory cell in the same nonvolatile semiconductor memory device.
Figure 8B:
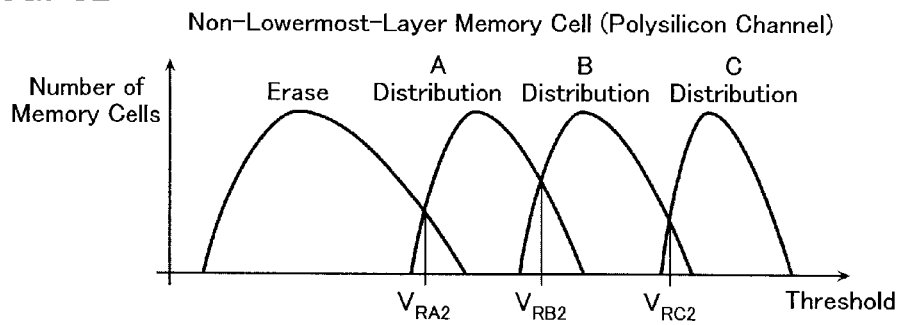

FIGS. 8A and 8B are histograms showing threshold distributions of the memory cell MC in the nonvolatile semiconductor memory device according to the present embodiment. The nonvolatile semiconductor memory device according to the present embodiment, similarly to those of the first through third embodiments, holds four types of data, namely Erase, A, B, and C, in the memory cell MC. Therefore, as shown in FIGS. 8A and 8B, the threshold voltage of each of the memory cells MC is distributed based on charge accumulated in the respective floating gates 14 of the memory cells MC.

FIG. 8A shows the threshold distributions of the lowermost-layer memory cell MC. The lowermost-layer memory cell MC includes the semiconductor layer 11b configured of bulk silicon, hence comparatively stable control is possible and a margin exists between the respective threshold distributions expressing data of Erase, A, B, and C. Therefore, if the read voltage and the verify voltage are set between these respective threshold distributions, the read operation can be appropriately performed. In FIG. 8A, $V_{RA1}$, $V_{RB1}$, and $V_{RC1}$ indicate the read voltage and verify voltage set in such a manner.

FIG. 8B shows the threshold distributions of the non-lowermost-layer memory cell MC. The non-lowermost-layer memory cell MC includes the semiconductor layer 11a configured of polysilicon, hence variation in the threshold distributions tends to extend, and a k-th (k is an integer of 1 to 3) threshold distribution and a (k+1)-th threshold distribution sometimes overlap each other. In this case, if a threshold voltage $V_1$ is set as a k-th read voltage, where said threshold voltage $V_1$ is defined as the threshold voltage that minimizes a difference between the number of memory cells MC belonging to the k-th threshold distribution whose threshold voltage is $V_1$ and the number of memory cells MC belonging to the (k+1)-th threshold distribution whose threshold voltage is $V_1$, then a rate of occurrence of misreads can be minimized. That is, in FIG. 8B, if the read voltage is set to be equal to a horizontal axis coordinate of a point of intersection of respective curves indicating the threshold distributions, then the rate of occurrence of misreads can be minimized. In FIG. 8B, $V_{RA2}$, $V_{RB2}$, and $V_{RC2}$ indicate the read voltage and verify voltage set in such a manner.

Now, as shown in FIGS. 8A and 8B, an optimal read voltage and verify voltage sometimes differ between the lowermost-layer memory cell MC and the non-lowermost-layer memory cell MC. Therefore, in the present embodiment, the read voltage and the verify voltage are set in consideration of such a difference in characteristics between the lowermost-layer memory cell MC and the non-lowermost-layer memory cell MC.

That is, if it is assumed that, in the lowermost-layer memory cell MC, read voltages $V_{RA1}$, $V_{RB1}$, and $V_{RC1}$ are the first read voltages, and verify voltages $V_{RA1}$, $V_{RB1}$, and $V_{RC1}$ are the first verify voltages, and that, in the non-lowermost-layer memory cell MC, read voltages $V_{RA2}$, $V_{RB2}$, and $V_{RC2}$ are the second read voltages, and verify voltages $V_{RA2}$, $V_{RB2}$, and $V_{RC2}$ are second verify voltages, then, as shown in FIGS. 8A and 8B, the second read voltages and the second verify voltages tend to have appropriate values which is larger than that of the first read voltages and the first verify voltages. Therefore, in the present embodiment, the second read voltages and the second verify voltages are respectively set larger than the first read voltages and the first verify voltages. As a result, in the present embodiment, misreads are reduced and reliability of the nonvolatile semiconductor memory device is increased.

Note that in the present embodiment, the first read voltage and the first verify voltage are set equal, and the second read voltage and the second verify voltage are set equal. However, it is also possible for the first read voltage and the first verify voltage, and the second read voltage and the second verify voltage to be set to different values.

Read Operation of Nonvolatile Semiconductor Memory Device According to Fifth Embodiment Next, a read operation of a nonvolatile semiconductor memory device according to a fifth embodiment will be described. The read operation according to the present embodiment is basically similar to the read operation according to the fourth embodiment, but a setting method of the read voltage and the verify voltage is different.

Figure 9:
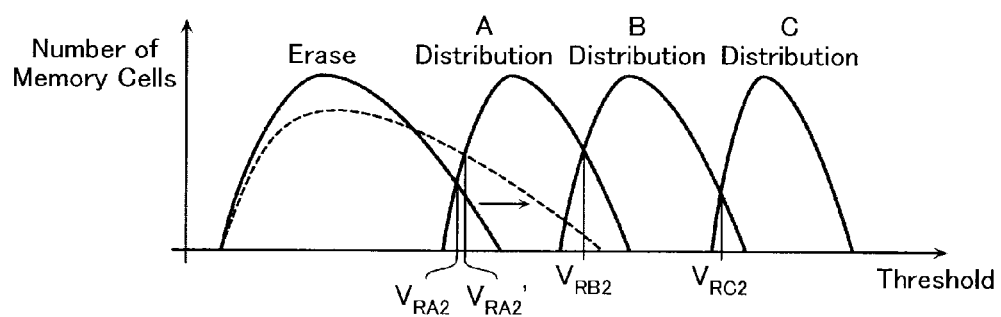
FIG. 9 is a histogram showing threshold distributions of a nonvolatile semiconductor memory device according to a fifth embodiment.
Figure 10:
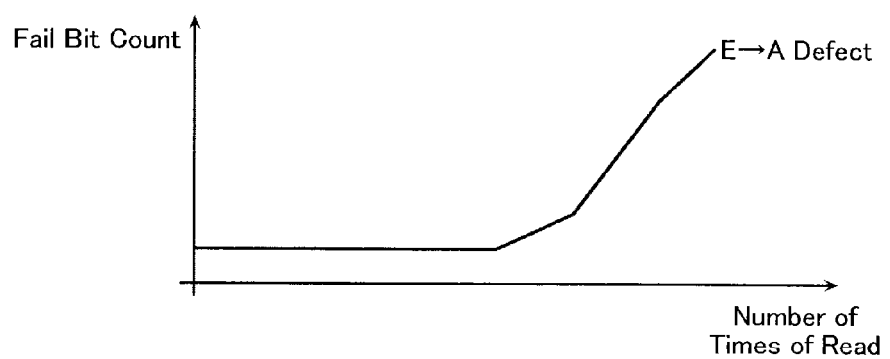
FIG. 10 is a graph showing characteristics of the same nonvolatile semiconductor memory device.

FIG. 9 is a histogram showing threshold distributions of the non-lowermost-layer memory cell MC when the read voltage is set comparatively large. FIG. 10 is a graph showing a relationship between the number of times of the read operation and an incidence rate of misreads when the read operation is performed a plurality of times in the memory cell MC. Sometimes, when the read voltage is set comparatively large, application of the read voltage to the control gate 16 causes charge to get accumulated in the floating gate 14, whereby, as shown by the dotted line in FIG. 9, the threshold distribution ends up spreading. As a result, an optimal read voltage and threshold voltage for reducing the incidence rate of misreads sometimes increase, whereby, as shown in FIG. 10, the incidence rate of misreads rises.

In the present embodiment, the read voltage and threshold voltage are set giving consideration also to a change in threshold distribution due to application of the above-described read voltage. Note that such a phenomenon manifests more significantly the larger the read voltage is, hence in the present embodiment, consideration is given to such effects during setting of the second read voltage and the second verify voltage. Moreover, such a phenomenon manifests more significantly the lesser the charge accumulated in the floating gate 14 is, hence in the present embodiment, the second read voltage and the second verify voltage set between the Erase distribution and the A distribution are set to $V_{RA2}'$ which is larger than the second read voltage and second verify voltage $V_{RA2}$ for data A in the fourth embodiment.

In addition, as shown in FIG. 10, the change in threshold distribution due to application of the above-described read voltage begins to manifest significantly when the number of times of the read operation exceeds a certain value. It is therefore also possible to, for example, count the number of times of the read operation performed on a certain memory cell layer, and perform adjustment of the read voltage $V_{RA2}'$ based on this count.

Nonvolatile Semiconductor Memory Device According to Sixth Embodiment

Figure 11:
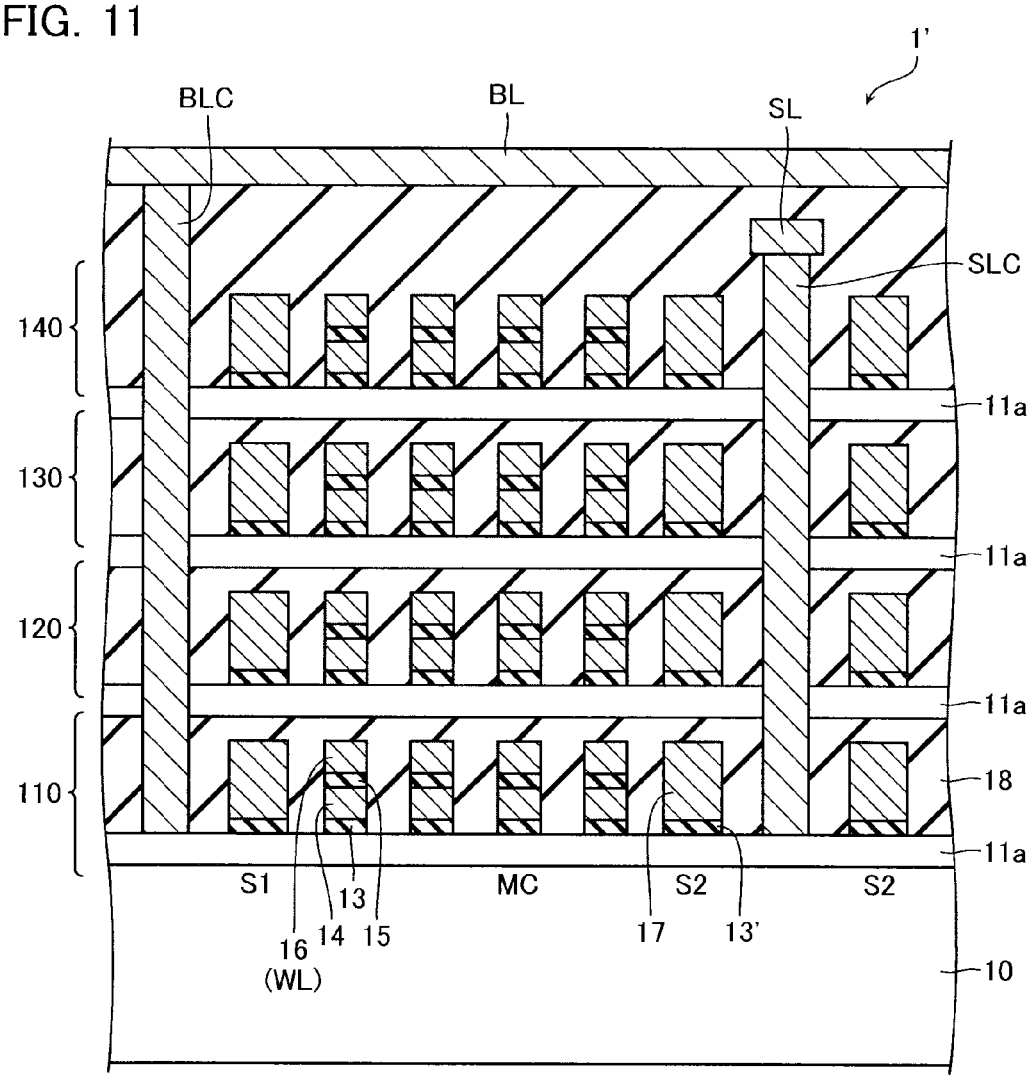
FIG. 11 is a schematic cross-sectional view showing part of a memory cell array in a nonvolatile semiconductor memory device according to a sixth embodiment.

Next, a nonvolatile semiconductor memory device according to a sixth embodiment will be described. FIG. 11 shows schematically a cross-sectional structure of a memory cell array 1' in the nonvolatile semiconductor memory device according to the present embodiment. The nonvolatile semiconductor memory device according to the present embodiment is configured substantially similarly to the nonvolatile semiconductor memory devices according to the first through fifth embodiments, but in the present embodiment, a configuration of the lowermost memory cell layer 110 is different. That is, in the first through fifth embodiments, the lowermost-layer memory cell MC adopted bulk silicon as the semiconductor layer 11b. In contrast, in the nonvolatile semiconductor memory device according to the present embodiment, the semiconductor layer 11a configured of polysilicon is disposed on the substrate 10 and adopted instead of the semiconductor layer 11b configured of bulk silicon. That is, the lowermost-layer memory cell MC and the non-lowermost-layer memory cell MC have a similar configuration. Note that although not illustrated here, such a configuration is employed in the likes of an SOI substrate having an insulating layer disposed between the substrate 10 and the semiconductor layer 11a.

In the present embodiment, the lowermost-layer memory cell MC and the non-lowermost-layer memory cell MC both adopt the semiconductor layer 11a configured of polysilicon, hence variation in characteristics of each of the memory cell layers can be significantly reduced. However, whereas the lowermost-layer memory cell MC and the memory cell MC formed in the uppermost memory cell layer 140 (hereinafter called "uppermost-layer memory cell MC") have another adjacent memory cell layer only positioned in a layer above or a layer below, the memory cell MC other than the lowermost-layer memory cell MC and the uppermost-layer memory cell MC (hereinafter called "intermediate memory cell MC") has another adjacent memory cell layer positioned in both the layer above and the layer below. Therefore, the floating gate 14 in the uppermost-layer memory cell MC and the lowermost-layer memory cell MC is less easily affected by capacitive coupling in a periphery and has different control characteristics, compared to the floating gate 14 in the intermediate memory cell MC.

The nonvolatile semiconductor memory device according to the present embodiment, during a similar write operation and read operation to those of the first through fifth embodiments, uses different control parameters for each of the uppermost-layer memory cell MC, the intermediate memory cell MC, and the lowermost-layer memory cell MC. Therefore, reliability of the nonvolatile semiconductor memory device can be further improved.

Note that in the present embodiment, different control parameters are set for each of the uppermost-layer memory cell MC, the intermediate memory cell MC, and the lowermost-layer memory cell MC. However, it is also possible for different control parameters to be set only for the uppermost-layer memory cell MC or the lowermost-layer memory cell MC, and it is also possible for control parameters for the uppermost-layer memory cell MC and the lowermost-layer memory cell MC to be set to an identical value. Moreover, it is also possible to perform control using a different parameter for the uppermost-layer memory cell MC in the first through fifth embodiments.

Other Embodiments

In each of the above-described embodiments, polysilicon was adopted as a material of the semiconductor layer 11a of the non-lowermost-layer memory cell MC. However, the control method according to each of the above-described embodiments may be adopted also in the case where, for example, monocrystalline silicon is grown above the insulating layer 18 of the memory cell layer from bulk silicon by a means such as epitaxial growth or the like. A crystal lattice of silicon grown above the insulating layer 18 is thought to be affected by surface state of the insulating layer 18, and is thought to have a different physical property to the semiconductor layer 11b formed on the substrate 100. Therefore, in this case too, adopting the control method according to each of the above-described embodiments enables reliability of the nonvolatile semiconductor memory device to be preferably improved.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array that stores data; and
   a control circuit that controls write and read of data to/from the memory cell array,
   the memory cell array including a plurality of memory cell layers that are stacked,
   each memory cell layer comprising a plurality of memory cells being arranged and formed on a semiconductor layer,
   each memory cell comprising: a channel, a source, and a drain that are formed in the semiconductor layer; a gate insulating layer formed on the channel; a charge accumulation layer formed on the gate insulating layer; an inter-layer insulating layer formed on the charge accumulation layer; and a control gate formed on the inter-layer insulating layer, and adjacent memory cells being connected in series sharing each other's source and drain to form a plurality of NAND strings in each memory cell layer,
   the plurality of memory cell layers including: a first memory cell layer where the semiconductor layer is configured of monocrystalline silicon; and a second memory cell layer where the semiconductor layer is configured of polycrystalline silicon,
   the control circuit, when writing data in the memory cell, performing a write operation that repeats a write cycle until the data is written in the memory cell, the write cycle applying a write voltage between the semiconductor layer and the control gate and performing a verify read that confirms whether the data has been written in the memory cell or not,
   the write voltage being set to a write start voltage in the write cycle immediately after start of the write operation, and in a second or later time of the write cycle after start of the write operation, being set to a voltage that is the write voltage in the write cycle one previous increased by an amount of a step voltage portion, and
   when controlling write of data to a memory cell belonging to the first memory cell layer, the step voltage portion being a first step voltage, and when controlling write of data to a memory cell belonging to the second memory cell layer, the step voltage portion being a second step voltage which is smaller than the first step voltage.

2. A nonvolatile semiconductor memory device, comprising:
   a memory cell array that stores data; and
   a control circuit that controls write and read of data to/from the memory cell array,
   the memory cell array including a plurality of memory cell layers that are stacked,
   each memory cell layer comprising a plurality of memory cells being arranged and formed on a semiconductor layer,
   each memory cell comprising: a channel, a source, and a drain that are formed in the semiconductor layer; a gate insulating layer formed on the channel; a charge accumulation layer formed on the gate insulating layer; an inter-layer insulating layer formed on the charge accumulation layer; and a control gate formed on the inter-layer insulating layer, and adjacent memory cells being connected in series sharing each other's source and drain to form a plurality of NAND strings in each memory cell layer, the plurality of memory cell layers including: a first memory cell layer where the semiconductor layer is configured of monocrystalline silicon; and a second memory cell layer where the semiconductor layer is configured of polycrystalline silicon, the control circuit, when writing data in the memory cell, performing a write operation that repeats a write cycle until the data is written in the memory cell, the write cycle applying a write voltage between the semiconductor layer and the control gate and performing a verify read that confirms whether the data has been written in the memory cell or not, the write voltage being set to a write start voltage in the write cycle immediately after start of the write operation, and in a second or later time of the write cycle after start of the write operation, being set to a voltage that is the write voltage in the write cycle one previous increased by an amount of a step voltage portion, and when controlling write of data to a memory cell belonging to the first memory cell layer, the write start voltage being a first write start voltage, and when controlling write of data to a memory cell belonging to the second memory cell layer, the write start voltage being a second write start voltage which is smaller than the first write start voltage.

3. A nonvolatile semiconductor memory device, comprising:

a memory cell array that stores data; and a control circuit that controls write and read of data to/from the memory cell array, the memory cell array including a plurality of memory cell layers that are stacked, each memory cell layer comprising a plurality of memory cells being arranged and formed on a semiconductor layer, the plurality of memory cell layers including: a first memory cell layer where the semiconductor layer is configured of monocrystalline silicon; and a second memory cell layer where the semiconductor layer is configured of polycrystalline silicon, the control circuit, when controlling write or read of data to/from a memory cell belonging to the first memory cell layer, performing control based on a first parameter, and when controlling write or read of data to/from a memory cell belonging to the second memory cell layer, performing control based on a second parameter that differs from the first parameter, the memory cell array including a first memory region that holds the data, and a second memory region that holds the first parameter and the second parameter, and the second memory region being provided in the first memory cell layer.

4. A nonvolatile semiconductor memory device, comprising:

a memory cell array that stores data; and a control circuit that controls write and read of data to/from the memory cell array, the memory cell array including a plurality of memory cell layers that are stacked, each memory cell layer comprising a plurality of memory cells being arranged and formed on a semiconductor layer, the plurality of memory cell layers including: a lowermost memory cell layer disposed in a lowermost layer; an uppermost memory cell layer disposed in an uppermost layer; and an intermediate memory cell layer disposed between the lowermost memory cell layer and the uppermost memory cell layer, the control circuit, when controlling write or read of data to/from a memory cell belonging to at least one of the lowermost memory cell layer and the uppermost memory cell layer, performing control based on a first parameter, and when controlling write or read of data to/from a memory cell belonging to the intermediate memory cell layer, performing control based on a second parameter that differs from the first parameter, the memory cell array including a first memory region that holds the data, and a second memory region that holds the first parameter and the second parameter, and the second memory region being provided in the lowermost memory cell layer.

5. A nonvolatile semiconductor memory device, comprising:

a memory cell array that stores data; and a control circuit that controls write and read of data to/from the memory cell array, the memory cell array including a plurality of memory cell layers that are stacked, each memory cell layer comprising a plurality of memory cells being arranged and formed on a semiconductor layer, the control circuit, when controlling write or read of data to/from a memory cell belonging to a certain memory cell layer, performing control based on a first parameter, and when controlling write or read of data to/from a memory cell belonging to another memory cell layer that differs from the certain memory cell layer, performing control based on a second parameter that differs from the first parameter, the memory cell array including a parameter storage region that holds the first parameter and the second parameter, and the parameter storage region being set in a lowermost memory cell layer, the lowermost memory cell layer being disposed in a lowermost layer of the plurality of memory cell layers.

6. The nonvolatile semiconductor memory device according to claim 5, wherein each memory cell comprises: a channel, a source, and a drain that are formed in the semiconductor layer; a gate insulating layer formed on the channel; a charge accumulation layer formed on the gate insulating layer; an inter-layer insulating layer formed on the charge accumulation layer; and a control gate formed on the inter-layer insulating layer, and adjacent memory cells are connected in series sharing each other's source and drain to form a plurality of NAND strings in each memory cell layer.

7. The nonvolatile semiconductor memory device according to claim 6, wherein the control circuit, when writing data in the memory cell, performs a write operation that repeats a write cycle until the data is written in the memory cell, the write cycle applying a write voltage between the semiconductor layer and the control gate and performing a verify read that confirms whether the data has been written in the memory cell or not, the write voltage is set to a write start voltage in the write cycle immediately after start of the write operation, and in a second or later time of the write cycle after start of the write operation, is set to a voltage that is the write voltage in the write cycle one previous increased by an amount of a step voltage portion, and the first parameter corresponds to a first step voltage, and the second parameter corresponds to a second step voltage.

8. The nonvolatile semiconductor memory device according to claim 6, wherein the control circuit, when writing data in the memory cell, performs a write operation that repeats a write cycle until the data is written in the memory cell, the write cycle applying a write voltage between the semiconductor layer and the control gate and performing a verify read that confirms whether the data has been written in the memory cell or not, the write voltage is set to a write start voltage in the write cycle immediately after start of the write operation, and in a second or later time of the write cycle after start of the write operation, is set to a voltage that is the write voltage in the write cycle one previous increased by an amount of a step voltage portion, and the first parameter corresponds to a first write start voltage, and the second parameter corresponds to a second write start voltage.

9. The nonvolatile semiconductor memory device according to claim 6, wherein the control circuit, at least one of a time of reading data from the memory cell and a time of a verify read that confirms whether the data has been written in the memory cell or not, applies a read voltage between the semiconductor layer and the control gate of a selected memory cell which is a target of a read or the verify read, and applies a read pass voltage between the semiconductor layer and the control gate of an unselected memory cell which is not the target of the read or the verify read, thereby determining the data held in the selected memory cell, and the first parameter corresponds to a first read pass voltage, and the second parameter corresponds to a second read pass voltage.

10. The nonvolatile semiconductor memory device according to claim 6, wherein the control circuit, at least one of a time of reading data from the memory cell and a time of a verify read that confirms whether the data has been written in the memory cell or not, applies a read voltage between the semiconductor layer and the control gate of a selected memory cell which is a target of a read or the verify read, and applies a read pass voltage between the semiconductor layer and the control gate of an unselected memory cell which is not the target of the read or the verify read, thereby determining the data held in the selected memory cell, and the first parameter corresponds to a first read voltage, and the second parameter corresponds to a second read voltage.

* * * * *